(12) United States Patent
Kamian et al.

(10) Patent No.: US 8,999,058 B2
(45) Date of Patent: Apr. 7, 2015

(54) HIGH-PRODUCTIVITY POROUS SEMICONDUCTOR MANUFACTURING EQUIPMENT

(75) Inventors: George D. Kamian, Scotts Valley, CA (US); Somnath Nag, Saratoga, CA (US); Subbu Tamilmani, San Jose, CA (US); Mehrdad M. Moslehi, Los Altos, CA (US); Karl-Josef Kramer, San Jose, CA (US); Takao Yonehara, Kanagawa (JP)

(73) Assignee: Solexel, Inc., Milpitas, CA (US)

( * ) Notice: Subject to any disclaimer, the term of this patent is extended or adjusted under 35 U.S.C. 154(b) by 1148 days.

(21) Appl. No.: 12/774,667

(22) Filed: May 5, 2010

(65) Prior Publication Data

US 2011/0030610 A1 Feb. 10, 2011

Related U.S. Application Data

(60) Provisional application No. 61/175,535, filed on May 5, 2009.

(51) Int. Cl.
*C30B 1/10* (2006.01)
*C25D 11/32* (2006.01)
(Continued)

(52) U.S. Cl.
CPC ............ *C25D 11/32* (2013.01); *H01L 31/1892* (2013.01); *C25D 17/001* (2013.01); *C25D 17/06* (2013.01); *C25D 11/005* (2013.01); *Y02E 10/50* (2013.01)

(58) Field of Classification Search
USPC ...................... 117/86, 90, 935, 2, 3
See application file for complete search history.

(56) References Cited

U.S. PATENT DOCUMENTS 4,043,894 A 8/1977 Gibbs
4,070,206 A 1/1978 Kressel et al.
(Continued)

FOREIGN PATENT DOCUMENTS

JP 06-260670 A 9/1994
JP 2002-2299661 A 10/2002
(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.
(Continued)

*Primary Examiner* — Bob M Kunemund
(74) *Attorney, Agent, or Firm* — John Wood

(57) ABSTRACT

This disclosure enables high-productivity fabrication of semiconductor-based separation layers (made of single layer or multi-layer porous semiconductors such as porous silicon, comprising single porosity or multi-porosity layers), optical reflectors (made of multi-layer/multi-porosity porous semiconductors such as porous silicon), formation of porous semiconductor (such as porous silicon) for anti-reflection coatings, passivation layers, and multi-junction, multi-band-gap solar cells (for instance, by forming a variable band gap porous silicon emitter on a crystalline silicon thin film or wafer-based solar cell). Other applications include fabrication of MEMS separation and sacrificial layers for die detachment and MEMS device fabrication, membrane formation and shallow trench isolation (STI) porous silicon (using porous silicon formation with an optimal porosity and its subsequent oxidation). Further the disclosure is applicable to the general fields of Photovoltaics, MEMS, including sensors and actuators, stand-alone, or integrated with integrated semiconductor microelectronics, semiconductor microelectronics chips and optoelectronics.

15 Claims, 10 Drawing Sheets

(51) Int. Cl.

| | |
|---|---|
| H01L 31/18 | (2006.01) |
| C25D 17/00 | (2006.01) |
| C25D 17/06 | (2006.01) |
| C25D 11/00 | (2006.01) |

(56) References Cited

U.S. PATENT DOCUMENTS

| | | | |
|---|---|---|---|
| 4,082,570 | A | 4/1978 | House et al. |
| 4,165,252 | A | 8/1979 | Gibbs |
| 4,249,959 | A | 2/1981 | Jebens |
| 4,251,679 | A | 2/1981 | Zwan |
| 4,348,254 | A | 9/1982 | Lindmayer |
| 4,361,950 | A | 12/1982 | Amick |
| 4,409,423 | A | 10/1983 | Holt |
| 4,427,839 | A | 1/1984 | Hall |
| 4,461,922 | A | 7/1984 | Gay et al. |
| 4,479,847 | A | 10/1984 | McCaldin et al. |
| 4,626,613 | A | 12/1986 | Wenham et al. |
| 4,672,023 | A | 6/1987 | Leung |
| 4,922,277 | A | 5/1990 | Carlson |
| 5,024,953 | A | 6/1991 | Uematsu et al. |
| 5,073,230 | A | 12/1991 | Maracas et al. |
| 5,112,453 | A | 5/1992 | Behr et al. |
| 5,208,068 | A | 5/1993 | Davis |
| 5,248,621 | A | 9/1993 | Sano |
| 5,316,593 | A | 5/1994 | Olson et al. |
| 5,348,618 | A | 9/1994 | Canham et al. |
| 5,397,400 | A | 3/1995 | Matsuno et al. |
| 5,458,755 | A | 10/1995 | Fujiyama et al. |
| 5,459,099 | A | 10/1995 | Hsu |
| 5,494,832 | A | 2/1996 | Lehmann et al. |
| 5,538,564 | A | 7/1996 | Kaschmitter |
| 5,645,684 | A | 7/1997 | Keller |
| 5,660,680 | A | 8/1997 | Keller |
| 5,681,392 | A | 10/1997 | Swain |
| 5,882,988 | A | 3/1999 | Haberern et al. |
| 5,928,438 | A | 7/1999 | Salami |
| 5,951,833 | A | 9/1999 | Yamagata |
| 6,091,021 | A | 7/2000 | Ruby |
| 6,096,229 | A | 8/2000 | Shahid |
| 6,114,046 | A | 9/2000 | Hanoka |
| 6,127,623 | A | 10/2000 | Nakamura et al. |
| 6,143,629 | A | 11/2000 | Sato |
| 6,204,443 | B1 | 3/2001 | Kiso et al. |
| 6,294,725 | B1 | 9/2001 | Hirschberg et al. |
| 6,331,208 | B1* | 12/2001 | Nishida et al. ............ 117/89 |
| 6,399,143 | B1 | 6/2002 | Chong |
| 6,416,647 | B1 | 7/2002 | Dordi et al. |
| 6,428,620 | B1 | 8/2002 | Yamagata et al. |
| 6,429,037 | B1 | 8/2002 | Wenham et al. |
| 6,441,297 | B1 | 8/2002 | Keller et al. |
| 6,448,155 | B1 | 9/2002 | Iwasaki et al. |
| 6,461,932 | B1 | 10/2002 | Wang |
| 6,524,880 | B2 | 2/2003 | Moon et al. |
| 6,534,336 | B1 | 3/2003 | Iwane |
| 6,551,908 | B2 | 4/2003 | Ukiyo et al. |
| 6,555,443 | B1 | 4/2003 | Artmann et al. |
| 6,566,235 | B2 | 5/2003 | Nishida et al. |
| 6,602,760 | B2 | 8/2003 | Poortmans et al. |
| 6,602,767 | B2 | 8/2003 | Nishida et al. |
| 6,613,148 | B1 | 9/2003 | Rasmussen |
| 6,624,009 | B1 | 9/2003 | Green et al. |
| 6,645,833 | B2 | 11/2003 | Brendel |
| 6,649,485 | B2 | 11/2003 | Solanki et al. |
| 6,653,722 | B2 | 11/2003 | Blalock |
| 6,664,169 | B1 | 12/2003 | Iwasaki et al. |
| 6,756,289 | B1 | 6/2004 | Nakagawa et al. |
| 6,818,104 | B2 | 11/2004 | Iwasaki et al. |
| 6,881,644 | B2 | 4/2005 | Malik et al. |
| 6,946,052 | B2 | 9/2005 | Yanagita et al. |
| 6,964,732 | B2 | 11/2005 | Solanki |
| 7,014,748 | B2 | 3/2006 | Matsumura et al. |
| 7,022,585 | B2 | 4/2006 | Solanki et al. |
| 7,026,237 | B2 | 4/2006 | Lamb |
| 7,368,756 | B2 | 5/2008 | Bruhns et al. |
| 7,402,523 | B2 | 7/2008 | Nishimura |
| 2002/0106874 | A1* | 8/2002 | Iwane et al. ............ 438/487 |
| 2002/0153039 | A1 | 10/2002 | Moon et al. |
| 2002/0168592 | A1 | 11/2002 | Vezenov |
| 2002/0179140 | A1 | 12/2002 | Toyomura |
| 2003/0017712 | A1 | 1/2003 | Brendel |
| 2003/0039843 | A1 | 2/2003 | Johnson |
| 2003/0124761 | A1 | 7/2003 | Baert |
| 2004/0028875 | A1 | 2/2004 | Van Rijn |
| 2004/0173790 | A1 | 9/2004 | Yeo |
| 2004/0259335 | A1 | 12/2004 | Narayanan |
| 2004/0265587 | A1 | 12/2004 | Koyanagi |
| 2005/0160970 | A1 | 7/2005 | Niira |
| 2005/0172998 | A1 | 8/2005 | Gee et al. |
| 2005/0176164 | A1 | 8/2005 | Gee et al. |
| 2005/0177343 | A1 | 8/2005 | Nagae |
| 2005/0199279 | A1 | 9/2005 | Yoshimine et al. |
| 2005/0274410 | A1 | 12/2005 | Yuuki et al. |
| 2005/0281982 | A1 | 12/2005 | Li |
| 2006/0021565 | A1 | 2/2006 | Zahler et al. |
| 2006/0043495 | A1 | 3/2006 | Uno |
| 2006/0054212 | A1 | 3/2006 | Fraas et al. |
| 2006/0070884 | A1 | 4/2006 | Momoi et al. |
| 2006/0105492 | A1 | 5/2006 | Veres et al. |
| 2006/0105912 | A1* | 5/2006 | Konle et al. ............ 502/439 |
| 2006/0196536 | A1 | 9/2006 | Fujioka |
| 2006/0231031 | A1 | 10/2006 | Dings et al. |
| 2006/0266916 | A1 | 11/2006 | Miller et al. |
| 2006/0283495 | A1 | 12/2006 | Gibson |
| 2007/0077770 | A1 | 4/2007 | Wang et al. |
| 2007/0082499 | A1 | 4/2007 | Jung et al. |
| 2008/0047601 | A1 | 2/2008 | Nag et al. |
| 2008/0157283 | A1 | 7/2008 | Moslehi |
| 2008/0210294 | A1 | 9/2008 | Moslehi |
| 2008/0264477 | A1 | 10/2008 | Moslehi |
| 2008/0289684 | A1 | 11/2008 | Moslehi |
| 2008/0295887 | A1 | 12/2008 | Moslehi |
| 2009/0042320 | A1 | 2/2009 | Wang et al. |
| 2009/0107545 | A1 | 4/2009 | Moslehi |
| 2009/0301549 | A1 | 12/2009 | Moslehi |
| 2010/0022074 | A1 | 1/2010 | Wang et al. |
| 2010/0116316 | A1 | 5/2010 | Moslehi et al. |

FOREIGN PATENT DOCUMENTS

| | | |
|---|---|---|
| WO | PCT/EP99/08573 | 5/2000 |
| WO | WO 2002055760 A1 | 7/2002 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005 pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE, 2006.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

(56) References Cited

OTHER PUBLICATIONS

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342. Apr. 1977.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996 Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) the Solar Energy Industry Association, 2006.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

\* cited by examiner

HIGH-PRODUCTIVITY POROUS SEMICONDUCTOR MANUFACTURING EQUIPMENT

CROSS-REFERENCE TO RELATED APPLICATIONS

This application claims priority to U.S. Provisional Patent Application Ser. No. 61/175,535, filed May 5, 2009, which is hereby incorporated by reference in its entirety for all purposes.

FIELD

This disclosure relates generally to the field of semiconductors. More specifically, the present disclosure relates to solar cell manufacturing equipment and processes.

BACKGROUND

Crystalline silicon (including multi- and mono-crystalline silicon) is the most dominant absorber material for commercial photovoltaic applications. The relatively high efficiencies associated with mass-produced crystalline silicon solar cells, in conjunction with the abundance of material, garner appeal for continued use and advancement. But the relatively high cost of crystalline silicon material itself limits the widespread use of these solar modules. At present, the cost of "wafering," or crystallizing silicon and cutting a wafer, accounts for about 40% to 60% of the finished solar module manufacturing cost. If a more direct way of making wafers were possible, great headway could be made in lowering the cost of solar cells.

There are different known methods of growing monocrystalline silicon and releasing or transferring the grown wafer. Regardless of the methods, a low cost epitaxial silicon deposition process and a high-volume, production-worthy low cost method of release layer formation may be prerequisites for wider use of silicon solar cells.

Porous semiconductor (PS) formation is a fairly new field with an expanding application landscape. The viability of this technology in solar applications may hinge on the ability to industrialize the process to large scale (at low cost), requiring development of very low cost-of-ownership, high-productivity porous silicon manufacturing equipment.

PS has been used in MEMS (micro-electro-mechanical systems) and related applications, where there is a higher tolerance for cost per unit area of the wafer than solar PV. The microelectronics industry achieves economy of scale through obtaining greater yield by increasing the number of die (or chips) per wafer, scaling the wafer size, and enhancing the chip functionality (or integration density) with each successive new product generation. In the solar industry, economy is achieved through the industrialization of solar cell and module manufacturing processes with low-cost, high-productivity equipment. Further economies are achieved through price reduction in raw materials through reduction of materials used per watt output of solar cells.

Some typical precursor chemistries for PS are: HF (49% in $H_2O$ typically), IPA (and/or acetic acid) and DI $H_2O$. IPA (and/or acetic acid) serves as a surfactant and assists in the uniform creation of PS. Additional additives may be used to enhance the electrical conductivity of the electrolyte, thus reducing its heating through ohmic losses. Mixtures of HF and chemicals other than IPA can be readily employed by those skilled in the art.

In order to achieve the necessary economy for solar, process cost modeling is studied to identify and optimize equipment performance. Three categories of cost make up the total cost picture: fixed cost (FC), recurring cost (RC) and yield cost (YC). FC is made up of items such as equipment purchase price, installation cost and robotics or automation cost. RC is largely made up of electricity, gases, chemicals, operator salaries and maintenance technician support. YC may be interpreted as the total value of parts lost during production.

To achieve the cost-of-ownership (CoO) numbers required by the solar field, all aspects of the cost picture must be optimized. The qualities of a low cost process are (in order of priority): 1) high productivity, 2) high yield, 3) low RC, and 4) low FC.

Designing highly productive equipment requires a good understanding of the process requirements and reflecting those requirements in the equipment architecture. High yield requires a robust process and reliable equipment, and as equipment productivity increases, so too does yield cost. Low RC is also a prerequisite for overall low CoO. RC can impact plant site selection based on, for example, cost of local power or availability of bulk chemicals. FC, although important, is diluted by equipment productivity.

With the above said, in summary, high productivity, reliable, efficient manufacturing equipment may be a prerequisite for low cost solar cells.

Achieving low RC requires efficient use of chemicals. In wet processes, "drag out" or chemical carried out of the reaction chamber, must be rinsed off the wafer. With a greater amount of "drag out," a correspondingly greater amount of rinse water is required to clean the wafer. Both of these factors add to CoO. Moreover, one must minimize the aging of chemicals so that they can be reused and/or recycled over an extended period.

SUMMARY

In the field of photovoltaics, this disclosure enables high-productivity fabrication of semiconductor-based separation layers (made of porous semiconductors such as porous silicon), buried reflectors (made of multi-layer/multi-porosity porous semiconductors such as porous silicon), formation of porous semiconductor (such as porous silicon) for anti-reflection coatings, passivation layers, and multi junction, multi-band-gap solar cells (for instance, by forming a wider band gap porous silicon emitter on crystalline silicon thin film or wafer based solar cells).

This disclosure also enables formation of porous semiconductor layers on both sides of a substrate by alternating or modulating the voltage polarity and current direction to enable forming porous semiconductor layers on both sides. A process that is often used subsequent to porous silicon formation is silicon deposition, sometimes in epitaxial form. Dual side porous silicon formation enables dual side epitaxial layer deposition, thereby lowering the attainable cost of ownership of the silicon deposition process and fabrication cost of the resulting double side released thin silicon substrates.

In the semiconductor field, it enables fabrication of MEMS separation layers for die detachment, and shallow trench isolation (STI) porous silicon (using porous silicon formation with an optimal porosity and its subsequent oxidation). Other applications include the general fields of MEMS, including sensors and actuators, stand-alone, or integrated with integrated semiconductor microelectronics. Another range of applications pertains to high-surface-area reaction test-vehicles for food and drug evaluation.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the claims.

BRIEF DESCRIPTION OF THE DRAWINGS

The features, nature, and advantages of the disclosed subject matter will become more apparent from the detailed description set forth below when taken in conjunction with the accompanying drawings, wherein:

FIG. 9B also shows an embodiment with vertical or near-vertical batch of substrates.

DETAILED DESCRIPTION

Although described with reference to specific embodiments, one skilled in the art could apply the principles discussed herein to other areas and/or embodiments.

Those with skill in the art will recognize that the disclosed embodiments have relevance to a wide variety of areas in addition to those specific examples described below.

The presently disclosed PS system design provides novel parallel or multi-wafer processing architecture, similar to low-cost, large-batch wet chemical processing in benches or tanks. Presently available PS tools rely on single wafer processing, which characteristically burdens each wafer with high capital cost, serial cumulative processing times, and excessive wafer handling/sealing, resulting in potential yield losses. The presently disclosed systems and methods may reduce the capital cost by a factor equal to the number of wafers in each stack or array. Furthermore, the proposed design may simplify automation, reduce the tool footprint, and enable downstream rinsing and drying.

Figure 1:
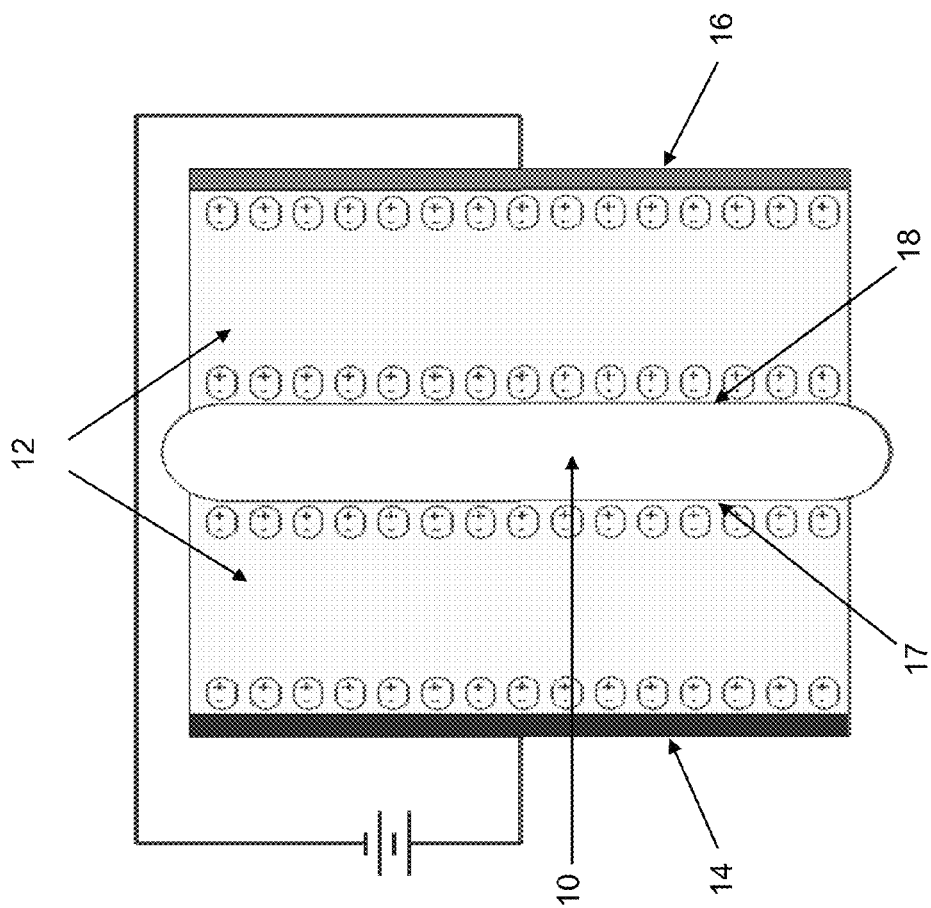
FIG. 1 shows a prior art diagram of a single wafer PS electrolytic bath arrangement.

FIG. 1 shows a schematic view of a prior art single wafer electrolytic bath arrangement for producing a layer of porous silicon through anodization. Wafer 10 is placed in electrolyte bath 12, between anode 14 and cathode 16. In one embodiment, electrolyte bath 12 may be HF/IPA. A porous silicon film is created on wafer frontside 18 as current is passed through the system; no porous silicon is formed on wafer backside 17. As current runs through the system, hydrogen gas may be evolved at cathode 16 and wafer backside 17; oxygen gas may be evolved at anode 14 and wafer frontside 18.

Figure 2:
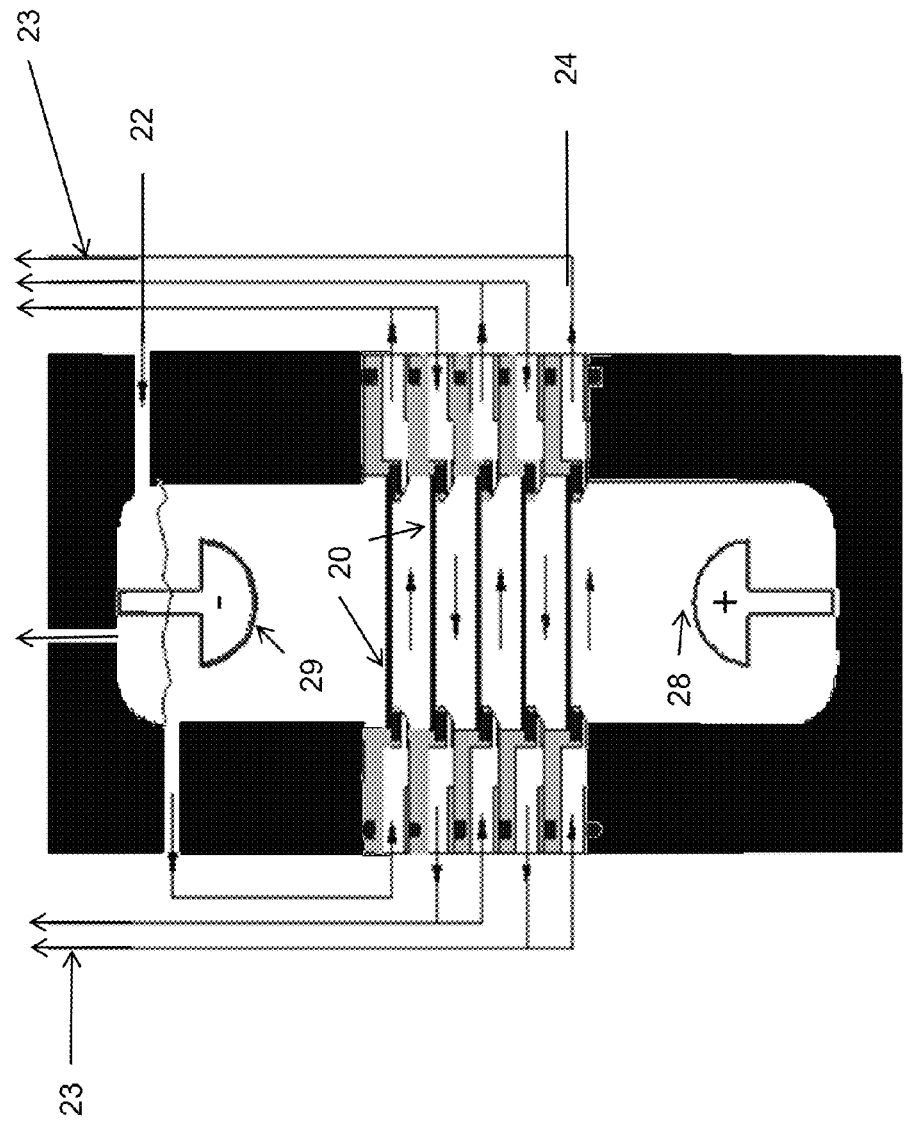
FIG. 2 depicts a "n" stack series array for multi-wafer processing.

FIG. 2 shows a side view of an "n" stack series array, designed to solve certain problems associated with known PS systems. In this arrangement, the electrolyte flows from supply 22, and the flow direction between wafers 20 is reversed from wafer to wafer. This reversal may allow simpler routing of the flow, but it is not a necessary feature of this disclosure. Electrolyte eventually flows out of the system from return 24. Anode 28 and cathode 29 provide the current that produces the layers of porous silicon. In an "n" stack system, the voltage seen by each wafer is V/n, where V is the total potential difference between anode 28 and cathode 29. Similarly, the pressure seen at each wafer is P/n, where P is the total pressure differential between supply 22 and return 24.

One challenge with any PS chamber is handling $H_2$ gas generated as a result of the anodic etch reaction that produces the PS. Hydrogen evolves from the surface of the wafer and each electrode. Since the electrolytic bath forms a part of the circuit, $H_2$ gas may block current flow when it displaces the electrolyte; the supply of chemicals to the reaction surface thus may affect PS formation. It is therefore desirable to effectively and rapidly purge or sweep $H_2$ byproducts from the surfaces of the wafer and electrodes. The wafer gap, fluid flow and design of the flow ports determine the effectiveness of the sweep. Hydrogen vent stacks 23 are provided to allow $H_2$ to be released after the electrolyte flow has swept it from the surfaces of the wafers.

While sweeping $H_2$ is fairly simple in terms of fluid mechanics, some consideration is warranted to mitigate the current loss from the fluid ports. Since the fluid lines are connected from wafer to wafer, depending on the geometry of the ports, line size and length, current can leak or bypass each wafer. For example reducing the line diameter and increasing the length results in greater electrical resistance, which reduces current losses or bypass losses. The current field lines are also influenced by the geometry adjacent to the wafer. So, large flow ports may be less desirable compared to multiple small ports.

The amount of wet chemical consumed during PS formation may be minimal compared to typical chamber flow rates. Therefore, if a more effective means of $H_2$ mitigation were utilized, the flow capacity of the overall system could be reduced, which would enable further cost reduction. Some key advantages of the batch design shown in FIG. 2 are the ability to share the chemical electrolyte bath, the ability to use a single pair of electrodes, and the reduction of the overall materials/components required in this multi-wafer scheme.

The outcome of the PS tool is a clean and dry PS film. By stacking and transporting the wafers, one could envision a second chamber which clamps the wafer stack in a similar way followed by a rinse, purge and dry. Again, the ability to process multiple wafers simultaneously plays nicely into CoO reduction.

One of ordinary skill will understand that different current levels and polarities may be used in the embodiment of FIG. 2 and the other FIGURES in order to produce bi-, tri-, or multi-layer PS embodiments, wherein each layer may have a different desired porosity level. By reversing the current polarity after the desired layer or layers have been produced, a double-sided PS coated wafer may be produced. In accordance with the present disclosure, it may be desirable to have multi-layer PS on both sides of a wafer, wherein both sides have similar or distinct layer structures.

Figure 3:
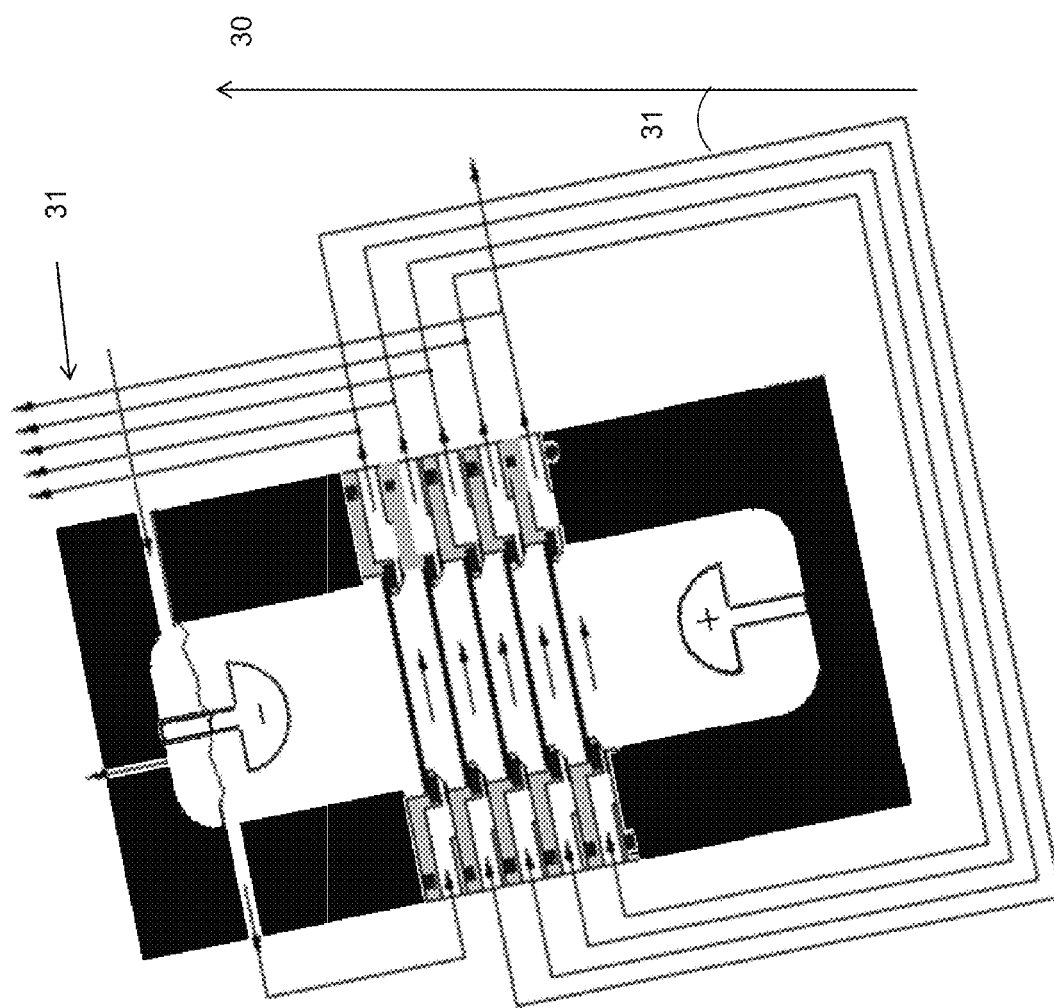
FIGS. 3 shows an embodiment similar to that shown in FIG. 2, but with a tilt angle imposed on the assembly and the $H_2$ sweep direction from left to right.

FIG. 3 shows a similar approach with a tilt angle 31 relative to vertical 30. imposed on the assembly and the $H_2$ sweep direction from left to right. With this approach, the flow requirements may be reduced significantly (because of the natural tendency of the evolved hydrogen to exit via hydrogen vent stacks 32) at a minor expense to mechanical complexity (because of the additional fluid routing requirements to have all the electrolyte channels flowing in the same direction). The chamber may tilted vertical during loading and unloading and filling. Various other embodiments of this scheme could include vertical reactor with the wafer slots cut at an angle in order to reduce the foot-print and also a "near-horizontal" reactor where the wafers are immersed entirely in the electrolytic fluid and the evolved $H_2$ is carried away by a headspace above the fluid level which connects to a single vent line. This arrangement may further reduce the complexity and cost of the H-vent manifolding.

While the upper chamber head space serves as the fluid "pressure head", in actuality, it may be necessary to introduce a pump (not shown) to provide sufficient pressure and flow throughout the "n" stack. Furthermore, if the wafer "n" stack is increased, this may further necessitate a pump. It may be advantageous in this situation to insure an equal pressure drop from wafer to wafer. The pressure difference is necessary to seat each wafer against a seal. Without sufficient pressure holding each wafer against its seal, current may be allowed to leak around the wafers and adversely affect PS formation and uniformity.

It also may be desirable to have voltage and current (or total power) be consistent from batch to batch. Since PS formation is an electrolytic process, as the wafer thickness changes (from template/substrate reuse) and the bath chemistry drifts (from HF consumption), the formation of PS may be affected. Real-time monitoring of the bath chemistry, combined with process characterization, may provide benefits in terms of determining the process robustness and insuring uniformity from batch to batch and within each batch.

The motivation for multi wafer processing is to reduce the capital cost per wafer and increase productivity, thereby reducing CoO. Another approach to achieving this goal is a planar array of wafers with a shared electrode.

Figure 4:
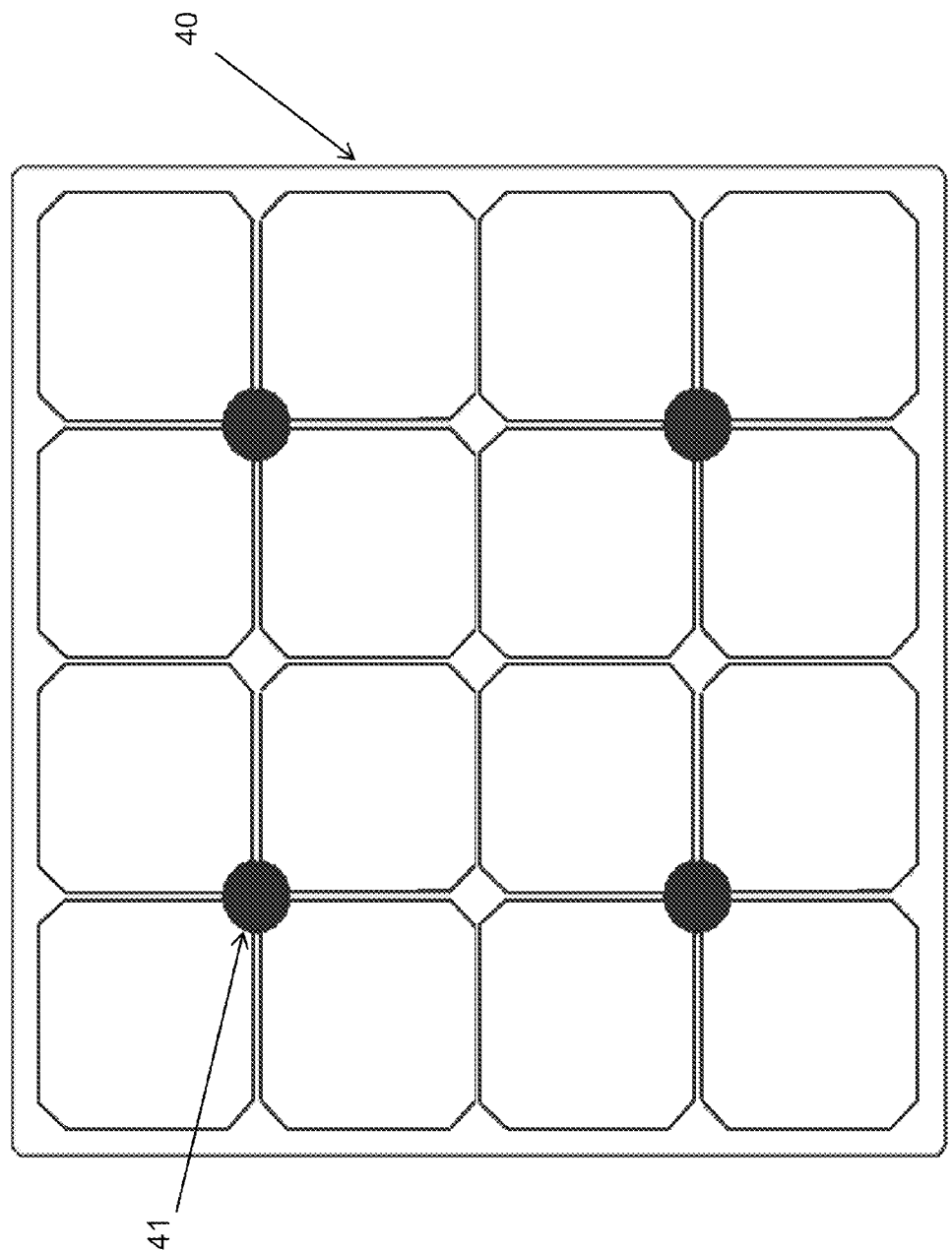
FIG. 4 provides a top view of a multi-wafer processing system involving a planar array of wafers having shared electrodes.

FIG. 4 shows a top view of another embodiment of the present disclosure for achieving multi-wafer processing. Sixteen wafers are shown, with only four electrode pairs. As shown, multiple wafers may share a single electrode to save on costs. In the embodiment shown, four wafers share one electrode pair, all within chamber perimeter 40. But one of ordinary skill will recognize that it may be advantageous to have more than four wafers sharing the electrode. Anode 41 is shown on one side of the array of wafers, and the cathode (not shown) is on the other side. Increasing the number of wafers per electrode pair may require a greater distance between the wafer surfaces and the electrode to insure that the current distribution (and thus PS formation) is uniform across the surfaces of the wafers. This arrangement is referred to as an "X-Y" array, due to the two-dimensional nature of the wafer array. One of ordinary skill will recognize that regardless of the number of wafers per electrode pair, the total array of wafers in the chamber may be any desired shape of square, rectangular, or non-rectangular array.

The wafers shown in FIG. 4 are depicted as "pseudo-square" wafers. One of ordinary skill in the art will recognize that any shape of wafer may be advantageously deployed in such an arrangement: for example, square, circular, or other shapes may be used.

Figure 5:
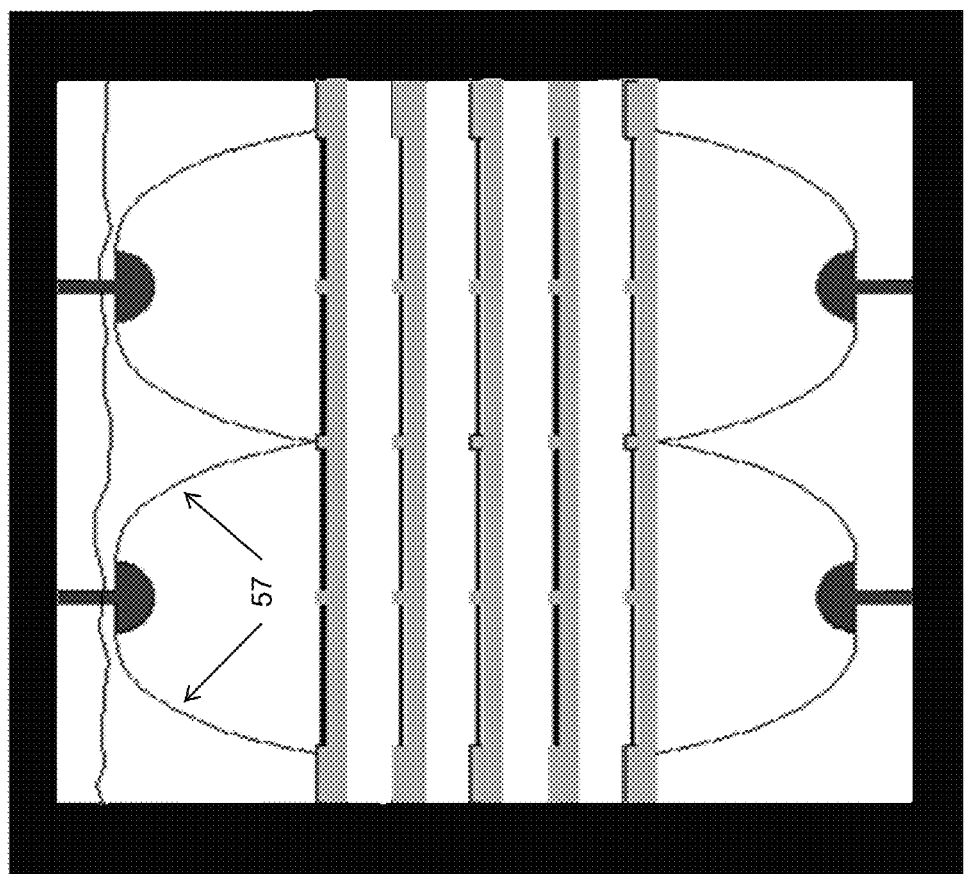
FIG. 5 provides a side view of the system shown in FIG. 4.

A further refinement of the arrangement of FIG. 4 is show in FIG. 5. While economies can be realized in an "X-Y" array, even further economies are realized by "n" stacking the "X-Y" arrays. The "X-Y" array may rely heavily on a high-conductivity bath in order to enable uniform fields (FIG. 5 shows schematically the general shape of field lines 57). Hydrogen evolution mitigation becomes even more important in the "X-Y" arrangement due to the distance vs. accumulation associated with the greater number of wafers. One may use an "X-Y" x "n" array where "n" represents the height direction (for instance, 5×5×1, 10×10×1, or 20×20×1, 10×10×5, 10×20×2, or any other desired arrangements of wafer positions). It is possible to produce a batch porous silicon reactor with more than one planar tray in the stack (i.e., n=2, 3 . . . 10 or even more). This design architecture provides very high productivity for very low cost porous silicon formation. The effective equipment throughput for formation of porous silicon layers with single porosity or multiple porosities on semiconductor wafers may be from several hundred wafers per hour to even thousands of wafers per hour.

Figure 6:
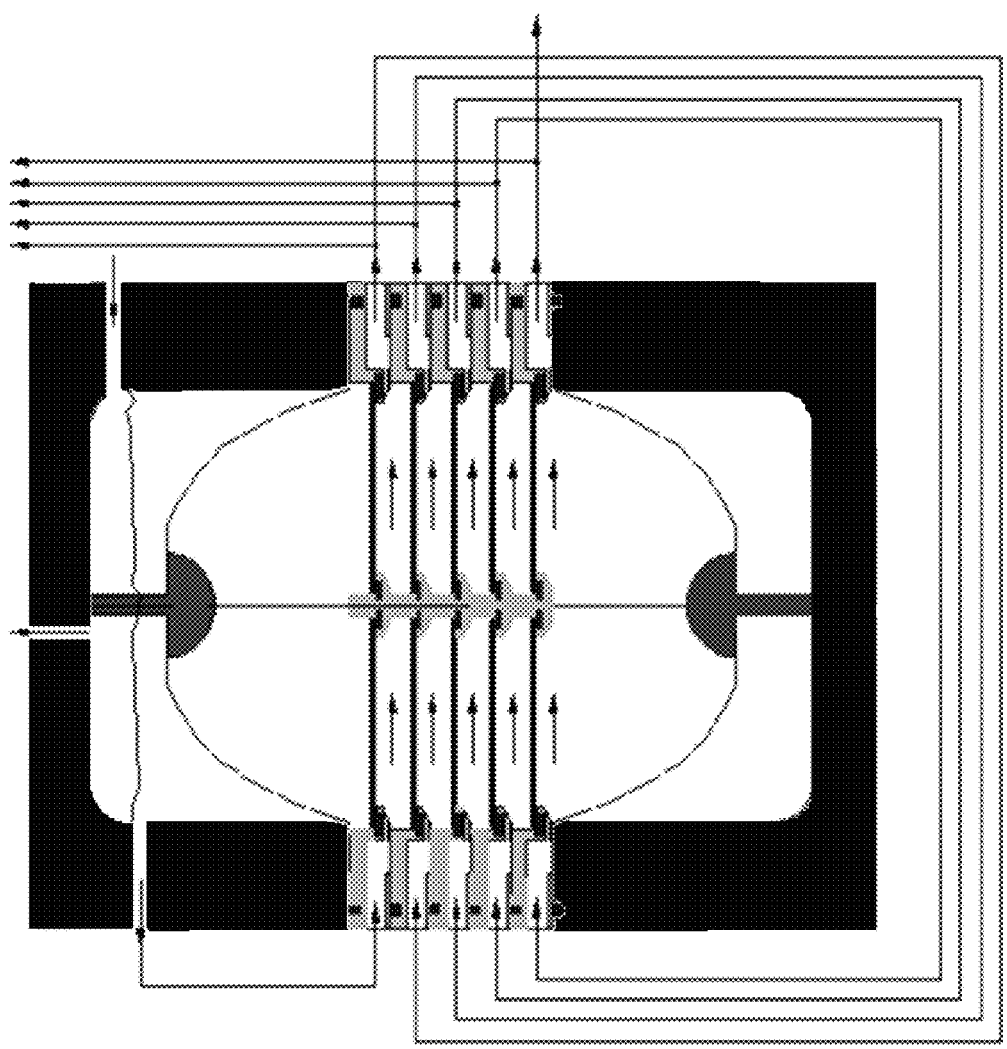
FIG. 6 shows a side view of a "hybrid" embodiment of the present disclosure involving the planar array and "n" stack series array embodiments.

FIG. 6 depicts a side view of a hybrid embodiment of the "X-Y" and "n" stack arrays. This embodiment could be tilted, as shown in FIG. 3, or not tilted, as shown in FIG. 2. Further, the electrolyte paths may be routed so that electrolyte flows in the same direction or opposite directions between each planar array of wafers. In the configuration shown, a 2×2×5 array example is revealed where one electrode set serves 20 wafers in a layout that could enable reasonable purging of $H_2$ gas. The actual number of wafers per stack tray and the number of stack levels may vary according to the design and throughput requirements.

Figure 7:
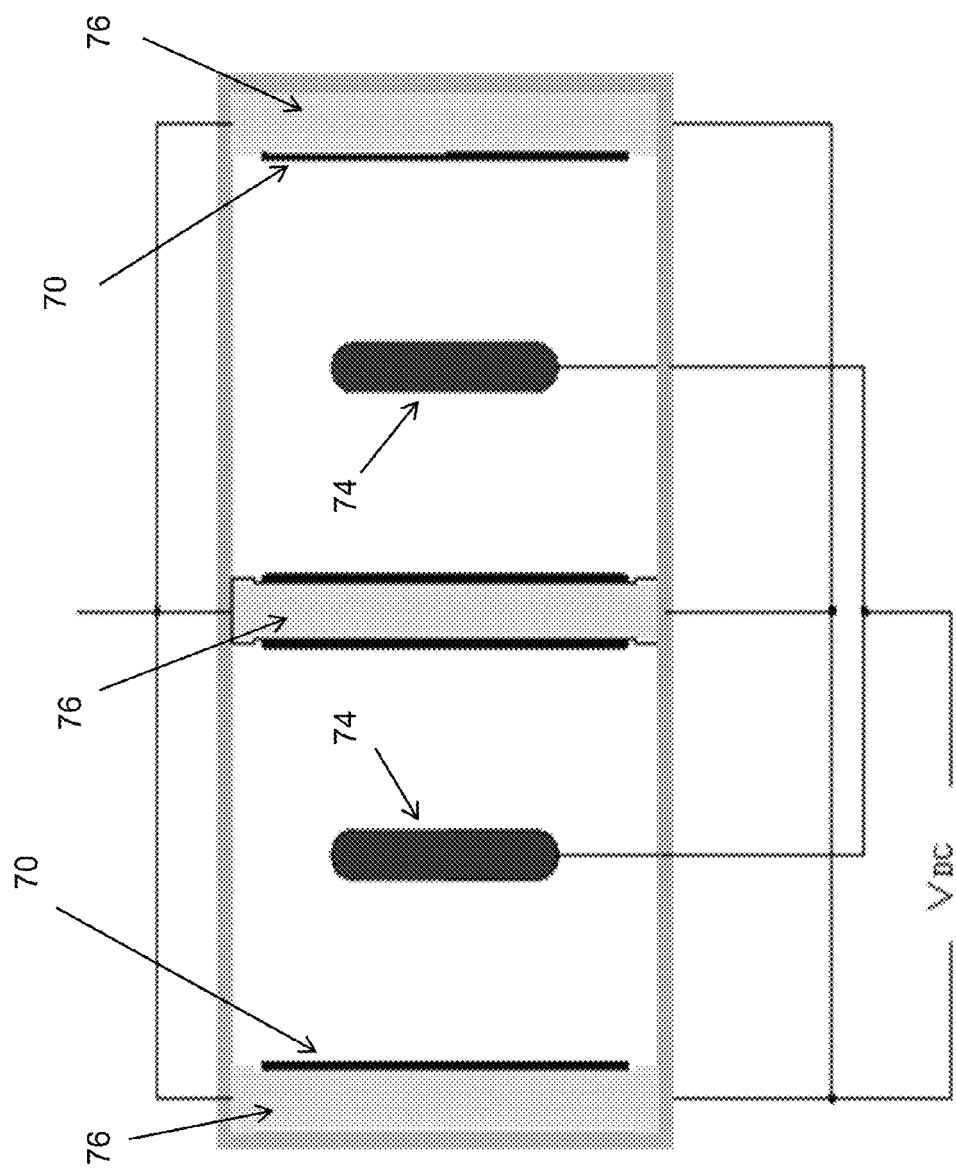
FIG. 7 provides another embodiment for multi-wafer processing.

FIG. 7 is yet another approach to shared capital resources. In this embodiment, each cathode 74 serves two wafers 70 and each wafer is clamped or chucked to the opposite electrode (anodes 76). If the wafers are oriented vertically, $H_2$ gas may naturally be vented to the top of the chamber. In this orientation, there may be no need for pumping or circulation of the electrolyte during processing. Further cost reduction may be realized by the material used in the dry wafer chuck. This design is expandable in the left and right direction as well as into the page.

Figure 8A:
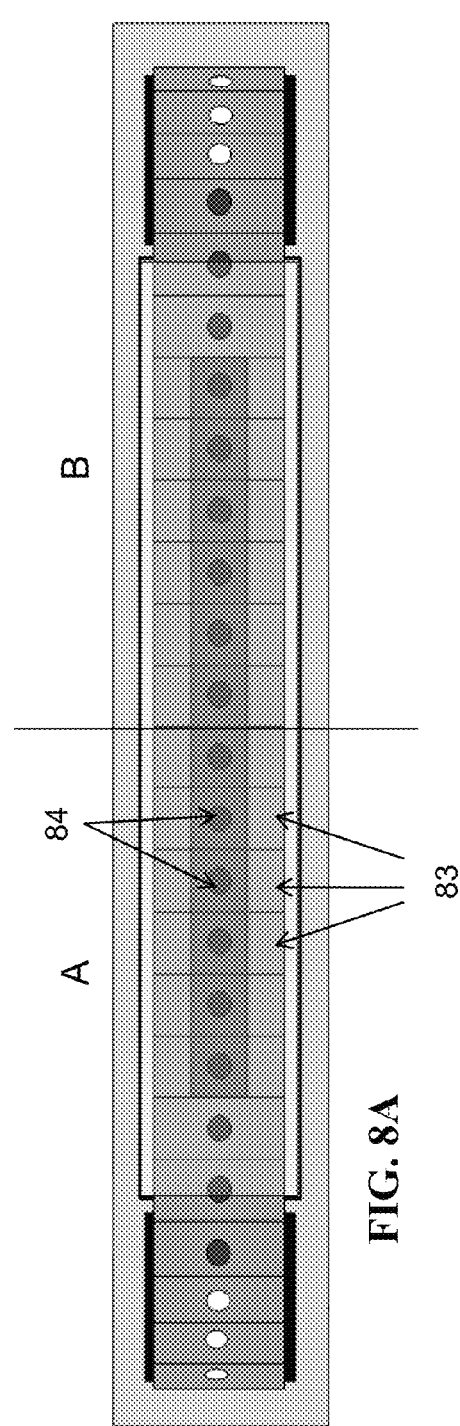
FIGS. 8A and 8B show top and side views, respectively, of an inline continuous embodiment for multi-wafer processing.
Figure 8B:
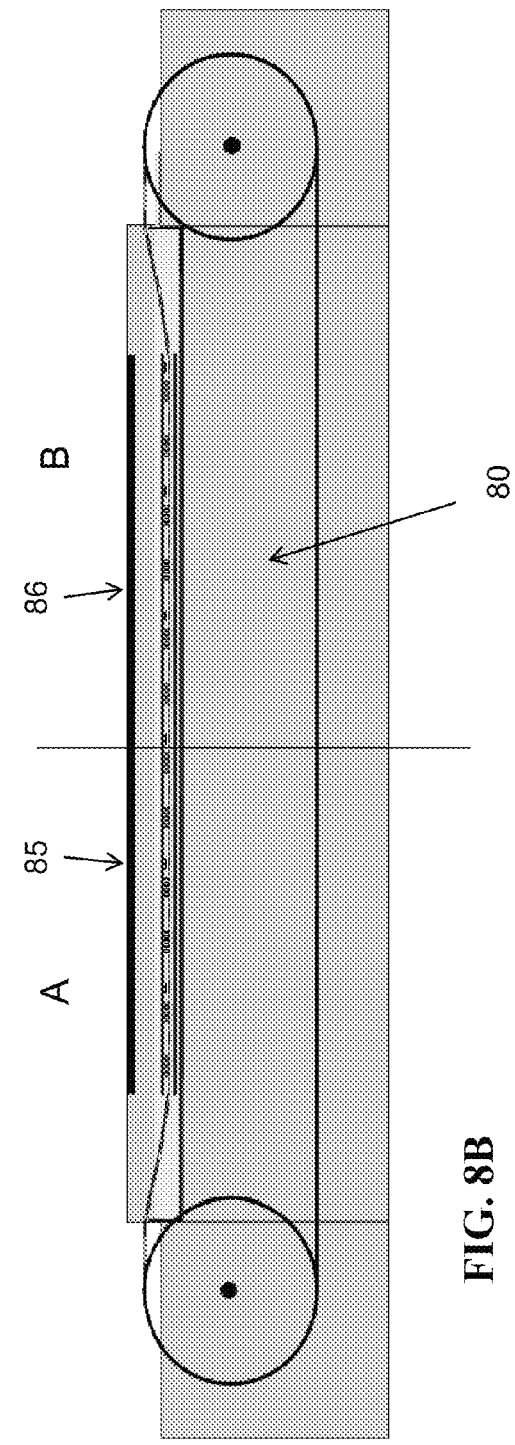

FIGS. 8A and 8B show views of one embodiment of a palletized immersion tank. A plurality of wafer-carrying pallets 83 may be conveyed through electrolyte bath 80 and passed under electrodes 85 and 86 for formation of PS on wafers 84. In this embodiment, there are two separate electrode regions, A and B, which enable both low and high porosity PS generation in line by having different voltages applied by the electrodes. The wafer carriers make contact with the side rails while the upper electrode is immersed in the bath. Another method to enable multiple porosity levels is to have 2 such electrolytic baths in series (Bath 1 & Bath 2) where the wafers travel through Bath 1 with a chemistry and current that enables a first porosity level, after which the wafers emerge out of Bath 1 on the conveyor and are then immersed into Bath 2 where a second chemistry and current enable a second distinct porosity level. The baths may be configured in meandering U-shape such that the effective footprint of this tool is kept low while meeting the residence time to achieve the PS layer properties.

Figure 9B:
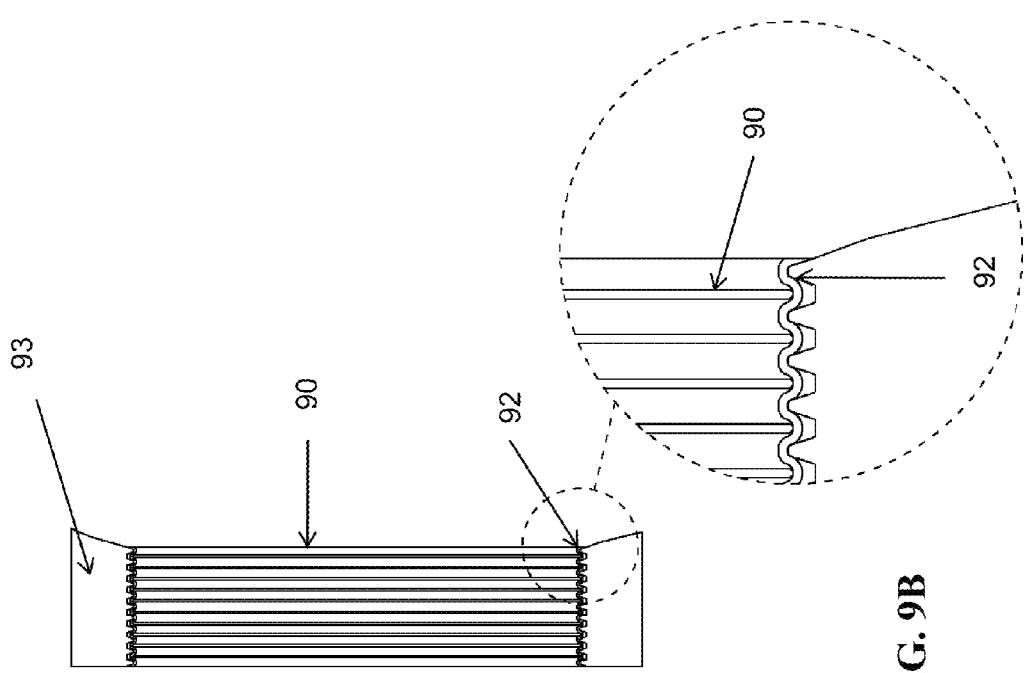
FIGS. 9A, 9B, and 9C show views of a wafer edge seal embodiment.
Figure 9A:
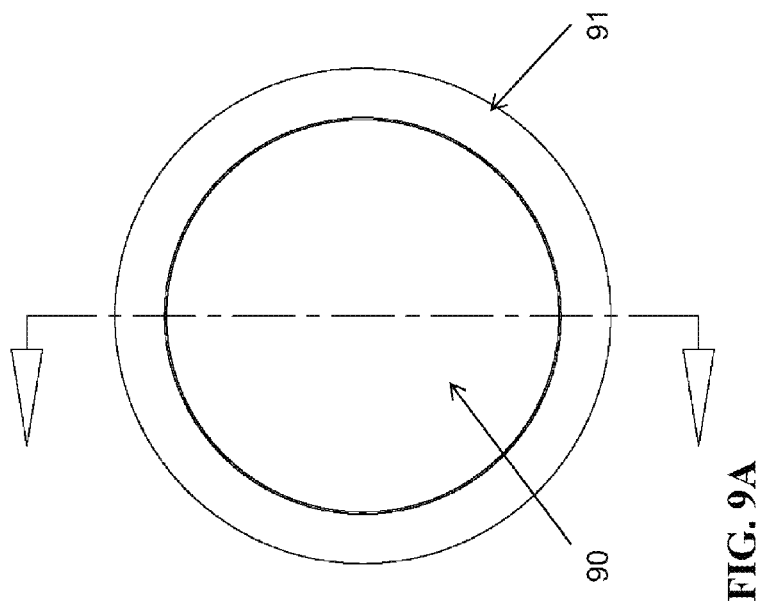

FIGS. 9A and 9B show a conforming wafer edge seal aspect of the present disclosure. FIG. 9A gives a view of the face of wafer 90 and housing 91.

FIG. 9B gives an edge-on view of a plurality of wafers 90 being held in place by edge seals 92, and a detail view of the interface between some wafers 90 and some edge seals 92. Hydrogen vent 93 is shown at the top of the plurality of wafers 90.

FIG. 9B shows a vertical or near-vertical arrangement of the substrates. In a vertical arrangement of the multi-substrate porous silicon formation chamber, a forced electrolyte flow is not necessarily required for operation, as byproduct gas emanating from the reacting surface may be naturally swept upwards through buoyancy and away from the reacting surface. It is therefore sufficient to vent the gas at the top, without allowing the electrolyte between each compartment to be in contact. The contact is avoided by using a compliant, impermeable edge seal.

The substrates themselves, together with the compliant, impermeable seal, form individual sealed compartments of electrolyte, and the leakage of electrolyte and electric field between compartments may be minimized or even completely avoided. This may enable uniform formation of the desired porous silicon structures across the whole exposed surfaces of the substrates.

It is to be noted that in addition to the compliant, impermeable edge seal, it may be advantageous to stabilize the substrates in their vertical arrangement. This could be done, among other options, by the geometrical restriction (see FIG. 9C for an example), as well as by the use of a perforated or sponge-like ring arrangement (see FIG. 9D for an example), which allows for permeation of both the electrolyte and the electric field, close to the substrate edge.

Figure 9D:
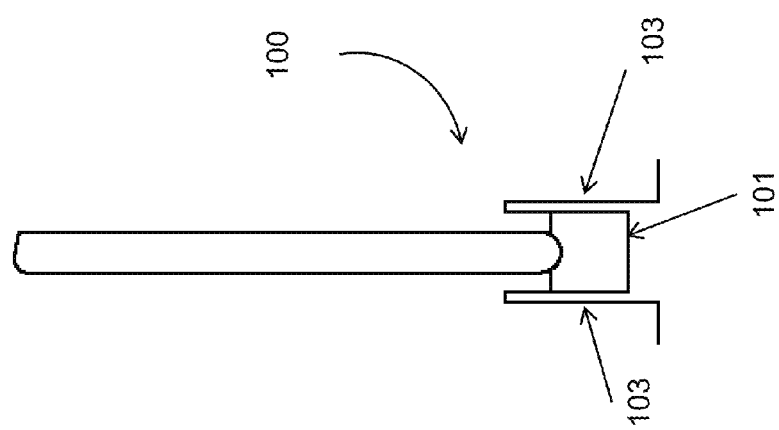
FIG. 9D shows a view of an alternate wafer edge seal embodiment.
Figure 9C:
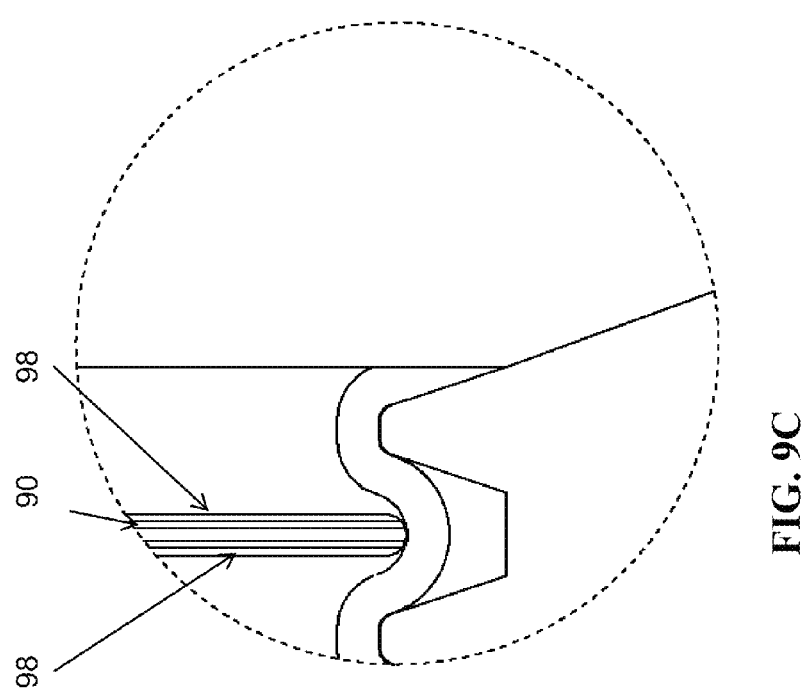

FIG. 9C shows a further enlarged view of the enlarged portion of FIG. 9B. This view shows that porous semiconductor such as porous silicon bi-layers or multi-layers 98 have been formed on both sides of wafer 90 by the alternation or modulation of the anodization current.

FIG. 9D shows an alternate embodiment 100 of the wafer edge seal of the present disclosure. Embodiment 100 shows that conforming edge seal 101 may be embedded within vertical seal components 103. This is in contrast to the continuous, curved (or so-called "geometrical") conforming seals shown in FIG. 9B. Seal components 103 may be permeable to the electrolyte and electric current, insuring that the portion of the wafer inside the seal region may be properly and uniformly anodized.

It may be advantageous to use either of the shown conforming edge seal embodiments for any of several reasons. In some applications, the wafers receiving the PS (porous semiconductor) layer may be reused a plurality of times, e.g. for the production of a thin film solar substrate that may be separated from the wafer by removal of the PS (porous semiconductor) layer. Under those circumstances, the exact dimensions of wafers 90 (thickness, diameter, shape, etc.) may vary slightly from one use to the next. For that reason, a conforming edge seal may be desirable to accommodate a range of slightly different shapes and sizes.

The embodiments of this disclosure may be used for formation of single sided and double sided porous semiconductor/porous silicon layers with either single or multi-porosity structures. The wafers with single sided porous semiconductor/porous silicon layers may be subsequently processed through single sided epitaxial semiconductor or silicon deposition, in order to generate thin epitaxial substrates from one side of such wafers, used as reusable templates.

Similarly, the wafers with double sided porous semiconductor/porous silicon layers may be subsequently processed through double sided epitaxial semiconductor or silicon deposition, in order to generate thin epitaxial substrates from both sides of such wafers, used as reusable templates, hence further reducing the cost of fabricating such thin epitaxial substrates.

The electrodes used in various porous semiconductor (silicon) equipment embodiments of this invention may be made of materials including, but not limited to, diamond, platinum, silicon, carbon, conductive materials coated with diamond or coated with diamond-like carbon, or other materials known in the art. Moreover, the electrode may be shaped as for instance, but not limited to, planar or curved discs, rods or rings. The electrode shape and size may be set to establish pre-specified electric field and current distribution.

The foregoing description of the exemplary embodiments is provided to enable any person skilled in the art to make and use the subject matter. Various modifications to these embodiments will be readily apparent to those skilled in the art, and the generic principles defined herein may be applied to other embodiments without the use of the innovative faculty. Thus, the subject matter claimed is not intended to be limited to the embodiments shown herein but is to be accorded the widest scope consistent with the principles and novel features disclosed herein.

It is intended that all such additional systems, methods, features and advantages that are included within this description, be within the scope of the claims.

What is claimed is:

1. An apparatus for producing a layer of porous semiconductor on a plurality of semiconductor wafers, comprising:
   a first electrode and a second electrode for producing an electrical current, wherein said first electrode and said second electrode are operable to alternate or modulate current and voltage polarity at least one cycle after a predetermined period of time;
   a plurality of semiconductor wafers in a stacked arrangement, wherein each said semiconductor wafer is held in place by a perimeter wafer seal disposed around a perimeter of said semiconductor wafer, and wherein said stacked arrangement may be at any angle relative to vertical;
   an electrolyte supply for providing an electrolyte to said apparatus; and
   a plurality of electrolyte channels or electrolyte compartments disposed between each of said plurality of semiconductor wafers for providing said electrolyte to at least a surface of each said semiconductor wafer and for removing a gas from said surface.

2. The apparatus of claim 1, wherein said plurality of semiconductor wafers comprises a plurality of silicon wafers.

3. The apparatus of claim 1, wherein said plurality of semiconductor wafers comprises either a plurality of square semiconductor wafers or a plurality of pseudo-square semiconductor wafers.

4. The apparatus of claim 1, wherein said plurality of semiconductor wafers comprises a plurality of substantially circular semiconductor wafers.

5. The apparatus of Claim 1, wherein said first electrode and said second electrode are operable to produce said electrical current at a plurality of predetermined levels for producing a plurality of layers having distinct porosities.

6. The apparatus of claim 5, wherein said plurality of predetermined levels comprises a set of discrete levels for multi-layer porosity.

7. The apparatus of claim 5, wherein said plurality of predetermined levels comprises a continuum of levels for graded porosity.

8. The apparatus of claim 1, wherein each said wafer seal comprises a conforming edge seal for adapting to a range of wafer diameters and wafer thicknesses.

9. An apparatus for producing a layer of porous semiconductor on a plurality of semiconductor wafers, comprising:
   a first electrode and a second electrode for producing an electrical current, wherein said first electrode and said second electrode are operable to alternate or modulate current and voltage polarity at least one cycle after a predetermined period of time;

a plurality of arrays of semiconductor wafers in a stacked arrangement, wherein each said semiconductor wafer is held in place by a perimeter wafer seal disposed around a perimeter of said semiconductor wafer, and wherein said stacked arrangement may be at any angle relative to vertical;

an electrolyte supply for providing an electrolyte to said apparatus; and a plurality of electrolyte channels or electrolyte compartments disposed between each of said plurality of arrays of semiconductor wafers for providing said electrolyte to at least a surface of each said semiconductor wafer and for removing a gas from said surface.

10. The apparatus of claim 9, wherein each said semiconductor wafer of said plurality of arrays of semiconductor wafers comprises either a square semiconductor wafer or a pseudo-square semiconductor wafer.

11. The apparatus of claim 9, wherein each said semiconductor wafer of said plurality of arrays of semiconductor wafers comprises a substantially circular semiconductor wafer.

12. The apparatus of Claim 9, wherein said first electrode and said second electrode are operable to produce said electrical current at a plurality of predetermined levels for producing a plurality of layers having distinct porosities.

13. The apparatus of claim 12, wherein said plurality of predetermined levels comprises a set of discrete levels for multi-layer porosity.

14. The apparatus of claim 12, wherein said plurality of predetermined levels comprises a continuum of levels for graded porosity.

15. The apparatus of claim 9, wherein each said wafer seal comprises a conforming edge seal for adapting to a range of wafer diameters and wafer thicknesses.

* * * * *